US006809769B1

(12) United States Patent
Yang

(10) Patent No.: US 6,809,769 B1
(45) Date of Patent: Oct. 26, 2004

(54) DESIGNS OF DIGITAL PIXEL SENSORS

(75) Inventor: David Xiao Dong Yang, Mountain View, CA (US)

(73) Assignee: Pixim, Inc., Mountain View, CA (US)

( * ) Notice: Subject to any disclaimer, the term of this patent is extended or adjusted under 35 U.S.C. 154(b) by 816 days.

(21) Appl. No.: 09/603,113

(22) Filed: Jun. 22, 2000

(51) Int. Cl.[7] .............................................. H04N 5/335
(52) U.S. Cl. ...................................... 348/308; 348/294
(58) Field of Search ................................ 348/294, 302, 348/308, 311, 373, 374, 375; 250/208.1; 378/98; 257/290, 291, 292, 231, 233, 222, 215

(56) References Cited

U.S. PATENT DOCUMENTS

| 5,336,879 | A | | 8/1994 | Sauer |
|---|---|---|---|---|
| 5,379,336 | A | * | 1/1995 | Kramer et al. ............. 378/98.8 |
| 5,529,197 | A | | 6/1996 | Grewal |
| 5,665,959 | A | * | 9/1997 | Fossum et al. .......... 250/208.1 |
| 5,721,429 | A | | 2/1998 | Radford et al. |
| 5,734,156 | A | | 3/1998 | Dahlin et al. |
| 5,781,233 | A | * | 7/1998 | Liang et al. ................. 348/302 |
| 5,812,191 | A | * | 9/1998 | Orava et al. ................ 348/308 |
| 5,904,495 | A | | 5/1999 | Burke et al. |
| 6,452,632 | B1 | * | 9/2002 | Umeda et al. .............. 348/294 |

* cited by examiner

Primary Examiner—Tuan Ho
(74) Attorney, Agent, or Firm—Patent Law Group LLP; Carmen C. Cook

(57) ABSTRACT

A digital photoimaging device is presented. The digital photoimaging device includes a photosensor array having supporting circuitry formed on a second substrate produced, for example, with CMOS process technology and photosensors formed on a first substrate. The first substrate is processed separately from the second substrate so that the photosensors formed on the first substrate can be optimized while also optimizing the circuitry formed on the second substrate. The first substrate is then placed into electrical contact with the second substrate so that signals from the photosensors on the first substrate arc received by the supporting circuitry on the second substrate. In one embodiment, the supporting circuitry includes an array of support circuits each including an analog-to-digital converter.

17 Claims, 9 Drawing Sheets

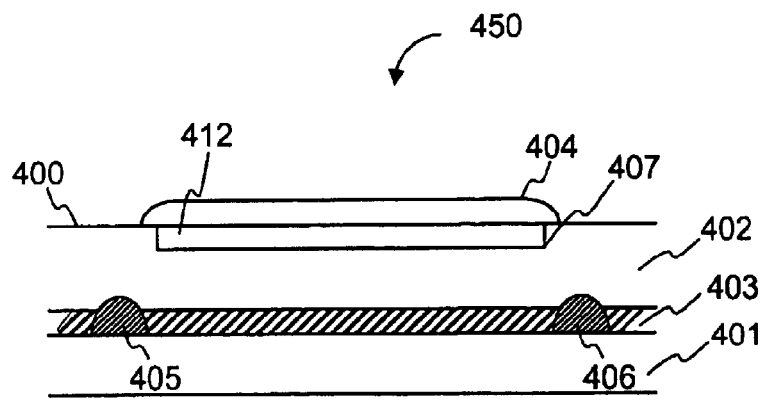
Figure 4A
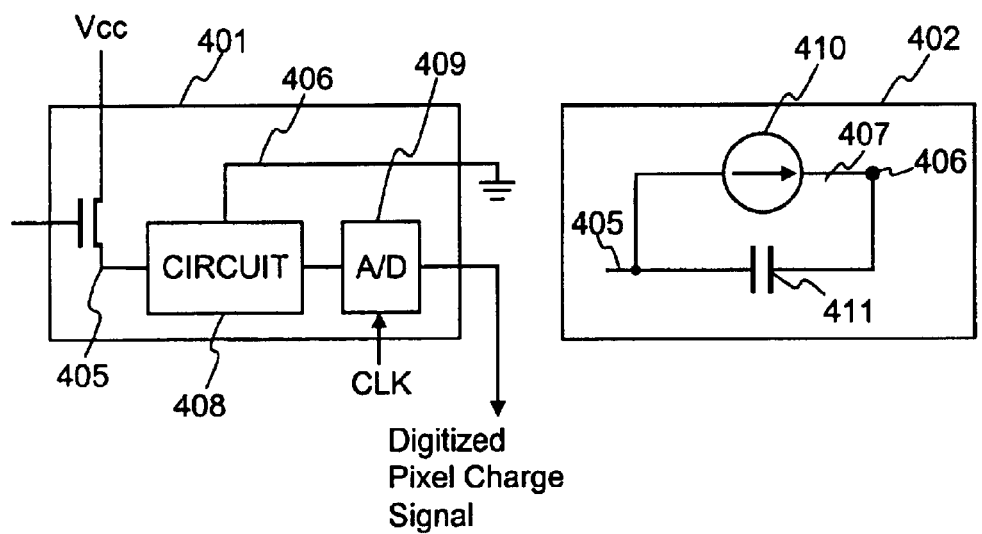
Figure 4B          Figure 4C

DESIGNS OF DIGITAL PIXEL SENSORS

BACKGROUND

1. Field of the Invention

This invention relates to image sensor systems and, more particularly, to an improved design for digital pixel sensors.

2. Related Art

Digital photography is one of the most exciting technologies that have emerged in the past years. With the appropriate hardware and software (and a little knowledge), anyone can put the principles of digital photography to work. Digital cameras, for example, are on the cutting edge of digital photography. Recent product introductions, technological advancements, and price cuts, along with the emergence of email and the World Wide Web, have helped make digital cameras the hottest new category of consumer electronics products.

Digital cameras, however, do not work in the way that traditional film cameras do. In fact, they are more closely related to computer scanners, copiers, or fax machines. Most digital cameras use an image sensor or photosensitive device, such as charged-coupled device (CCD) or Complementary Metal-Oxide Semiconductor (CMOS) to sense a scene. The photosensitive device reacts to light reflected from the scene and can translate the strength of that reaction into electronic charging signals that are further digitized. By passing light through red, green, and blue filters, for example, the reaction can be gauged for each separate color spectrum. When the readings are combined and evaluated via software, the camera can determine the specific color of each segment of the picture. Because the image is actually a collection of numeric data, it can easily be downloaded into a computer and manipulated for more artistic effects.

Digital cameras, however, do not have the resolution attainable with conventional photography. While traditional film-based technology, limited only by the granularity of the chemically based film, typically has a resolution of tens of millions of pixels, image sensors for use in most commercially viable digital cameras acceptable to general consumers have a resolution of slightly more than a million pixels.

Furthermore, the dynamic range of digital image sensors is often not as broad as is capable with film-based conventional photography. This is especially true for CMOS image sensors which, in general, have lower dynamic ranges than do CCDs. FIG. 1 shows a block diagram of a digital image sensor 10 as disclosed in U.S. Pat. No. 5,461,425 to Fowler, et al. As is shown, an image sensor core 12 have a two-dimensional array of pixels 15, each having a light detecting elements (photodetectors or photosensors) coupled to a dedicated A/D converter which outputs a stream of bits representative of the analog output of the light detecting element. In other words, the image sensor by Fowler outputs directly digital image data. Not only does subsequent supporting circuitry become dramatically simplified, but also there are numerous advantages provided by this architecture in view of the traditional CMOS image sensors. The advantages include better control of operations of the image sensor and far better image qualities therefrom. However, adding a dedicated A/D converter to each of the light detecting elements could introduce some practical problems that may limit the deployment of such image sensors. One of the problems is that the image sensor core 12 is inevitably larger than it would be without the dedicated A/D converters. If an image sensor is desired to have millions of photodetectors thereon, there would be a large number of dedicated A/D converters, which could take a significant amount of space in the image sensor core. Larger image sensor cores typically mean high cost and low yield. There is therefore a need for new designs of digital image sensors that directly produce the digital image data. Further, the sensitivity of the photodetectors could be compromised when the photodetectors are needed to be smaller to accommodate the dedicated A/D converters in an image sensor of limited size. Under normal processing, the efficiency and sensitivity of the photosensitive portion of the pixel is decreased with decreased CMOS device size. Additionally, the photosensors suffer increasingly large leakage currents, and therefore become increasingly noisier, as feature sizes are decreased. This decreased sensitivity results in pixel devices with correspondingly lower dynamic ranges, resulting in the need for further supporting circuitry at the pixel to compensate. The increased amount of supporting circuitry at the pixel defeats the benefits of smaller device sizes for the chip. Therefore, there is another need for devices with CMOS photosensors having high efficiencies and sensitivity while maintaining small device sizes for supporting circuitry.

SUMMARY

In accordance with the present invention, photosensors of an imaging sensor are constructed on a first substrate and supporting circuitry for the photosensors are constructed on a second substrate. The first substrate and the second substrate are then electrically coupled such that each of the photosensors on the first substrate are electrically coupled the supporting circuitry on the second substrate. In one embodiment, the first substrate and the second substrate are electrically coupled through bumping. In other words, bumps of conductive material (e.g., indium) are formed on a top surface of the second substrate, the bumps being electrically coupled to the supporting circuitry. Vias and similarly conducting bumps are constructed appropriately in the first substrate so that photosensors on the first substrate are electrically coupled to the bumps on the second substrate when the first substrate and the second substrate are aligned. In most embodiments, the first substrate is positioned in contact with the second substrate and bonded into place. In some embodiments, the first and second substrates can be produced using the same processing technology (e.g. CMOS) while in other embodiments different processing technologies can be utilized for producing the substrates.

In one embodiment, the imaging device includes an array of pixels. Each pixel includes a photosensor and pixel supporting circuitry for that photosensor. According to the present invention, the photosensor is formed on the first substrate and electrically coupled through a via and bumping technology to the pixel supporting circuitry on the second substrate. In another embodiment, multiplexing circuitry may also be formed on the first substrate and multiple photosensors can thus utilize the same bump in the second substrate to couple signals between photosensors on the first substrate with pixel support circuits on the second substrate.

Different embodiments of the invention may yield one or more of the following advantages and benefits. First, the size of an image sensor employing the present invention will not be enlarged significantly to accommodate the large number of pixel-level supporting circuits and therefore the sensitivity of the image sensor can be preserved. Second, the yield of semiconductor wafers in production of such an image sensor can be maintained as the size of the image sensor remains nearly unchanged. As a result, the cost of such image sensors is controlled and the popularity of the image sensors can be materialized.

These and further embodiments of the invention are discussed in more detail below with reference to the following figures. Other objects, benefits and advantages of embodiments of the invention are also discussed below.

BRIEF DESCRIPTION OF THE FIGURES

FIGS. 4A through 4D show respectively block diagrams of a digital image sensor according to the present invention.

DETAILED DESCRIPTION

Figure 1:
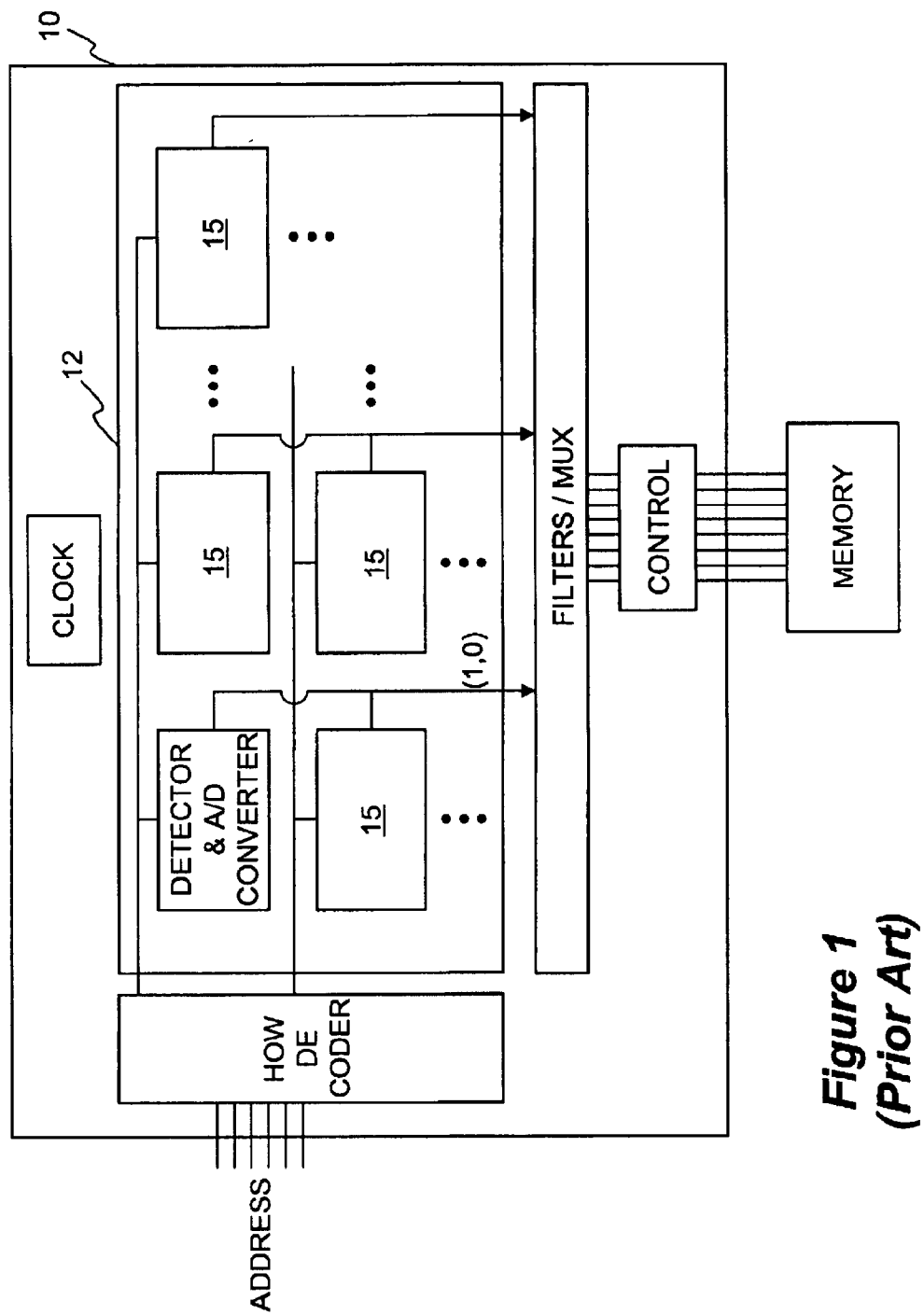
FIG. 1, (Prior Art ) shows an image sensor as described in US Patent No. U.S. Pat. No. 5,461,425 to Fowler, et al.
Figure 2A:
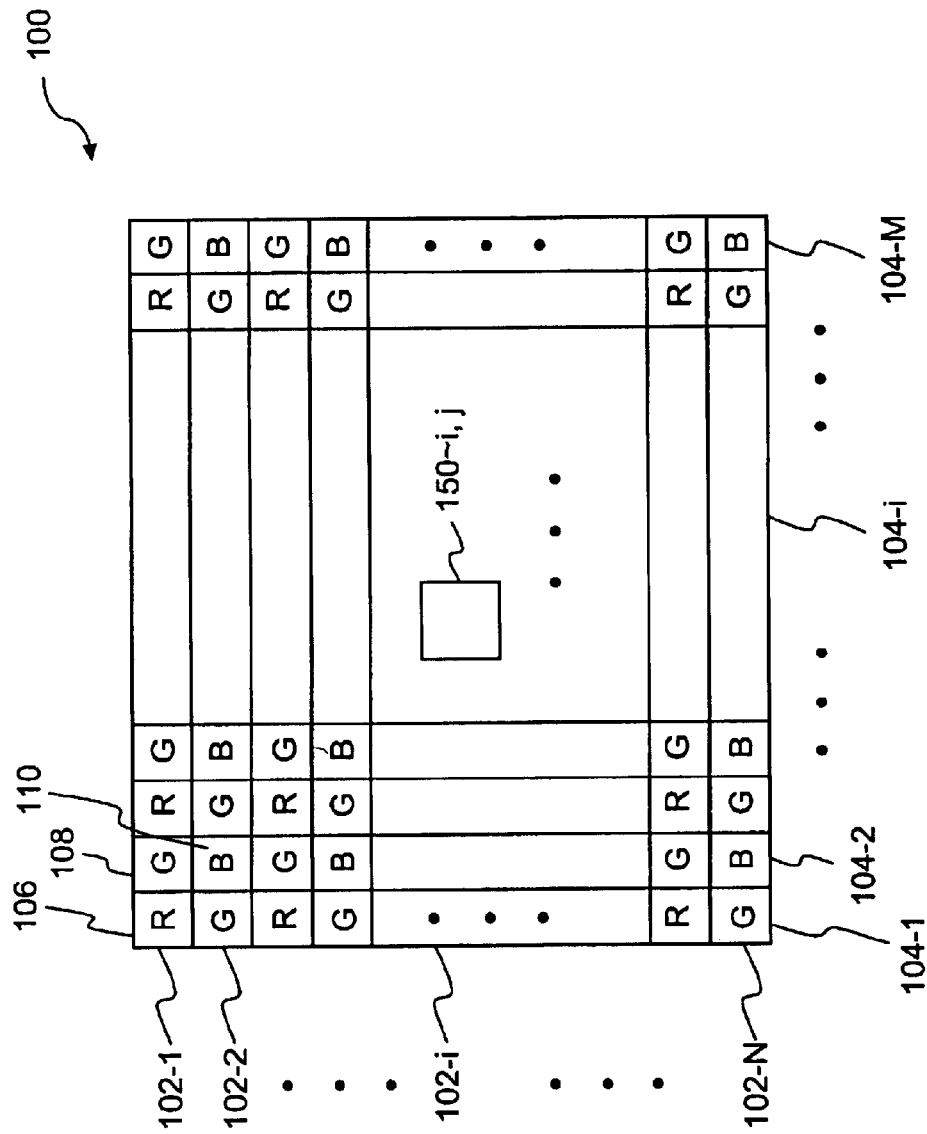
FIG. 2A shows a block diagram of a CMOS image sensor or photosensitive device according to the present invention.

FIG. 2A shows a photosensor array (image sensor) 100 in which the present invention may be practiced. Photosensor array 100 can be used in any image capturing device (for example, a digital camera) for either stationary or video image capture. Photosensor array 100, which is typically at least partially fabricated on a substrate utilizing CMOS technology, comprises a plurality of pixels 150-$i,j$ arranged in an array. In FIG. 2A, individual pixel 150-$i,j$ is arranged in row 102-$i$ and column 104-$j$ where row 102-$i$ is one of rows 102-1 through 102-N and column 104-$j$ is one of columns 104-1 through 104-M. For color detection, each pixel 150-$i,j$ can include an optical filter (e.g., a red filter, blue filter, or green filter). Pixels 150-$i,j$ are then arranged in a mosaic of selectively transmissive filters so that different groups of pixels 150-$i,j$ detect light of different colors. For example, a first group 106 of pixels 150-$i,j$ can detect a red spectrum, a second group 108 of pixels 150-$i,j$ can detect a green spectrum, and a third group 110 of pixels 150-$i,j$ can detect a blue spectrum. The resolution of photosensor array 100 is determined by the number of rows and columns. In FIG. 2A, the resolution of photosensor array 100 is N by M which, in many applications, can be 1000 pixels by 1000 pixels, for example.

Figure 2B:
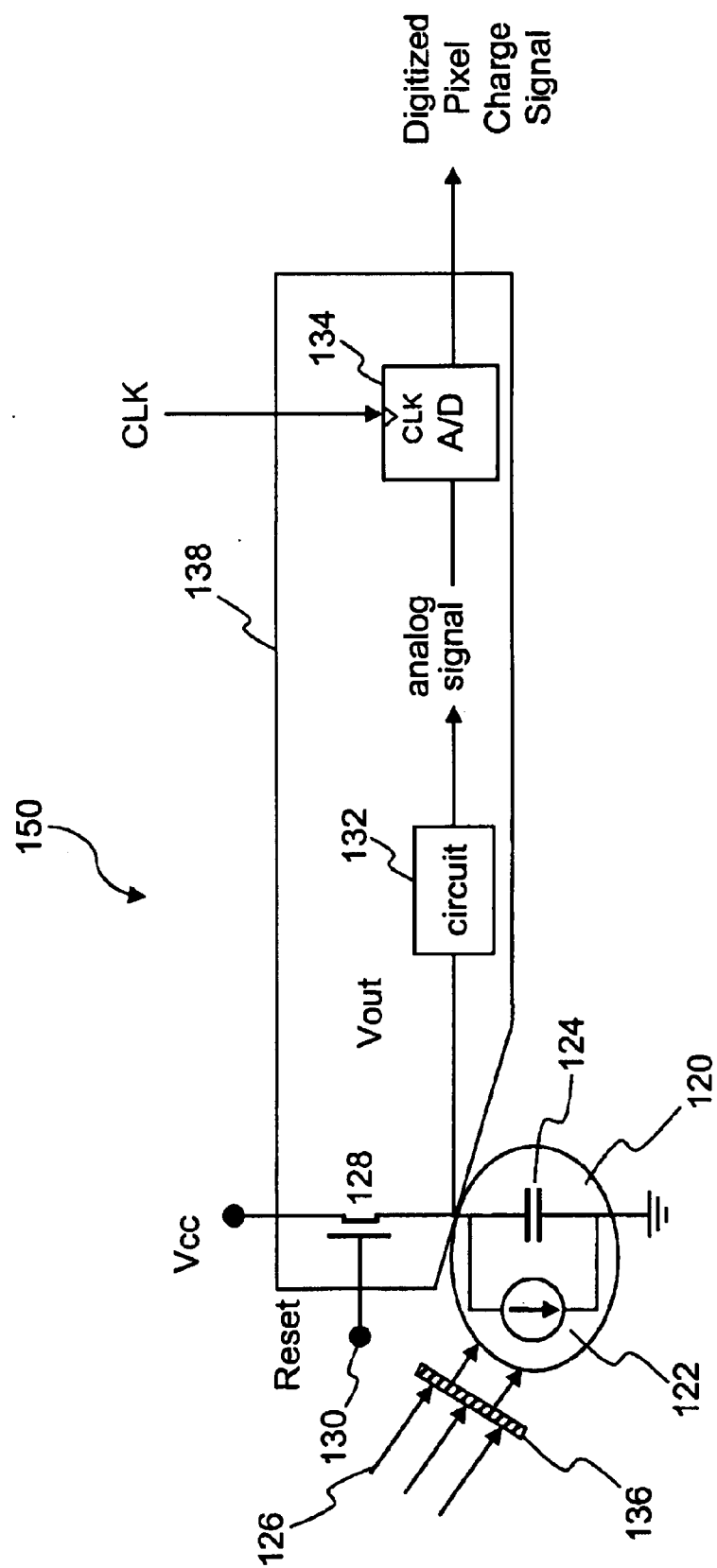
FIG. 2B shows an exemplary block diagram of a digital pixel sensor circuit according to the present invention.

Each pixel 150-$i,j$ in photosensor array 100 includes a photosensor that produces an electrical signal when exposed to light. FIG. 2B shows an example of a single pixel 150, which can be any one of pixels 150-$i,j$ in photosensor array 100. Pixel 150, therefore is a member of one of pixel groups 106, 108, or 110.

In FIG. 2B, Pixel 150 indicates one embodiment of a circuit for one of pixels 150-$i,j$ in photosensor array 100 (FIG. 2A). Pixel 150 includes a photosensor 120, which can be a photodiode, and pixel supporting circuitry 138. Photosensor 120 may be represented as a current source 122 in parallel with a capacitor 124. Photodiode 120 is coupled in series with the source and drain of transistor 128 and the combination of photosensor 120 and transistor 128 is coupled between a voltage $V_{cc}$ and ground. Gate 130 of transistor 128 is coupled to receive a reset signal. When the reset signal to gate 130 is set high, turning transistor 128 on, capacitor 124 is charged to $V_{cc}$ less the threshold voltage of transistor 128, $V_{Th}$. After the reset signal is set high long enough to charge capacitor 124, then the reset signal is set low to turn transistor 128 off. Capacitor 124 then discharges through current source 122.

Current source 122 discharges capacitor 124 at a rate dependant on the number of photons striking photosensor 120. Photons from light 126, filtered through filter 136, are incident on photosensor 120. The voltage across capacitor 124, then, is dependent on the total number of photons that strike photosensor 120. A voltage output signal $V_{out}$, which is the voltage across capacitor 124, is indicative of the integrated light intensity between the time that transistor 128 is turned off and the time that light 126 incidents on photosensor 120 is turned off.

Circuit 132 is coupled to receive the voltage output signal $V_{out}$ from capacitor 124.

Circuit 132 enhances the voltage output signal $V_{out}$ to create a pixel charge signal. The pixel charge signal is an enhanced voltage output signal suitable for coupling to following analog-to-digital conversion circuitry. It should be noted that circuit 132 is not necessary in some embodiments. Depending on an exact implementation, the use of circuit 132 may increase the sensitivity of pixel 150.

Operation of an image sensor such as pixel 150 shown in FIG. 2B, involves a light integration process followed by a readout process. Each of these two processes is sustained for a controlled time interval. First, capacitor 124 is charged by turning transistor 128 on. Then in the light integration process as described above, light 126 is incident on photosensor 120 for a set period of time, i.e. the exposure time. The interval during which the light integration process proceeds is referred to as exposure control, which may be achieved by electronic shuttering, and it controls how much charge is dispersed by photosensor 120. After the light integration process, pixel 150 starts the readout process during which the pixel charge signal in each photodetector is read out via readout circuitry to a data bus or video bus. After the time of integration, the pixel charge signal is measured by circuit 132 and digitized by A/D converter 134 to yield a digitized pixel charge signal, indicating the amount of exposure of pixel 150. A/D converter 134 can have any degree of accuracy (e.g. 8, 10 or 16 bits).

A/D converter 134 is coupled to input the pixel charge signal (i.e. an analog signal) from circuit 132 and digitizes the analog signal when triggered by the CLK signal to produce a digitized pixel charge signal. The advantage of digitizing the pixel charge signal within pixel 150, as opposed to circuitry outside of pixel 150 as is conventionally accomplished, is that digitized pixel charge signals can be readout of each pixel 150-$i,j$ in photosensor array 100 at much higher speeds than can a corresponding analog signal. Further detailed description of the pixel level digitalization is discussed in U.S. Pat. No. 5,461,425, which is herein incorporated by reference in its entirety.

Figure 3:
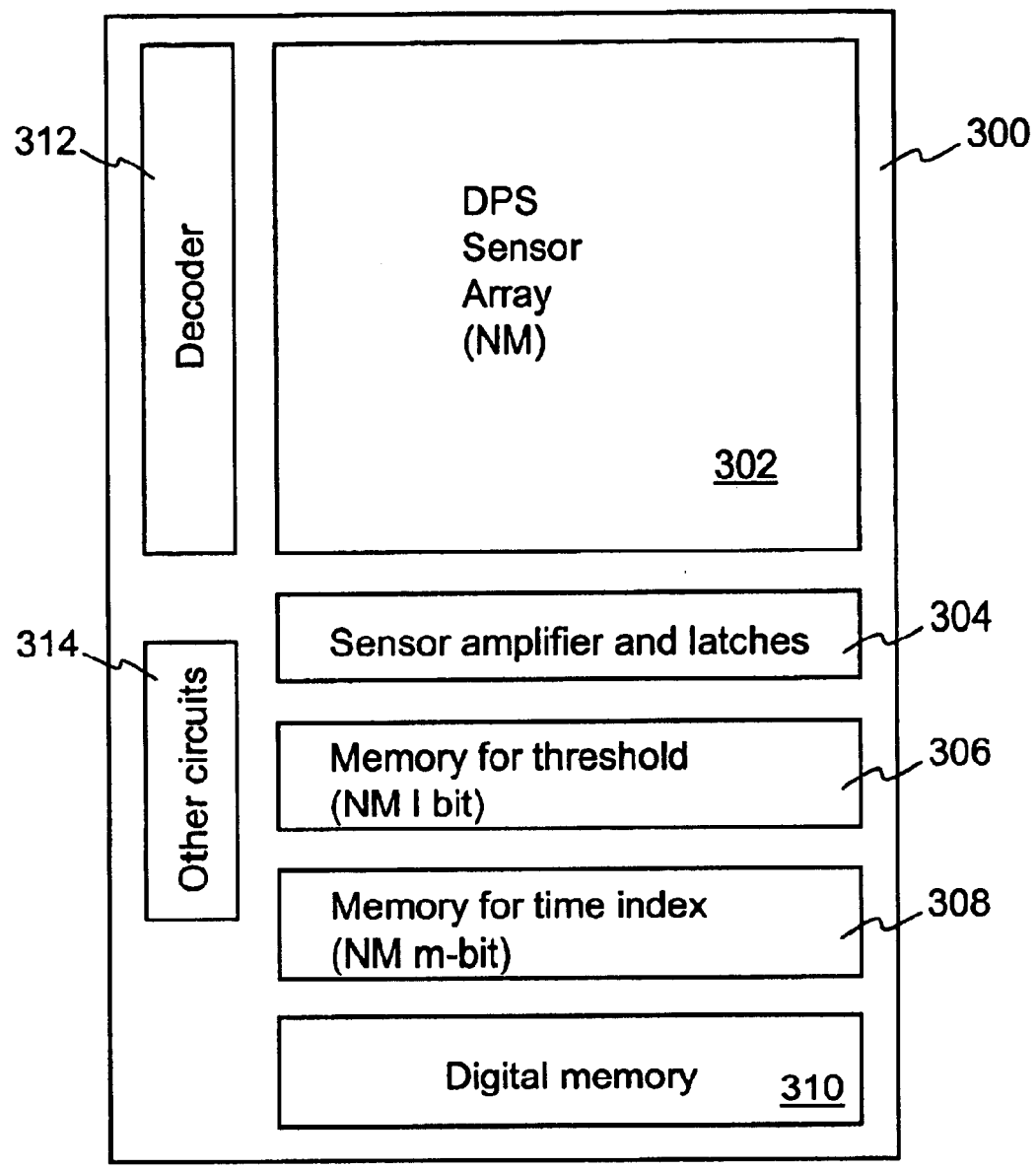
FIG. 3, shows a block diagram of a digital image sensor according to the present invention.

FIG. 3 shows a functional diagram of an image sensor 300 according to the present invention. Image sensor 300 includes a sensor array 302 which has an N by M array of pixels similar to those described in FIGS. 2A and 2B. A sense amplifier and latches circuit 304 is coupled into sensor array 302 to facilitate the readout of digital signals from sensor array 302. A threshold memory 306, a time index memory 308, and digital memory 310 are coupled to sensor array 302. Since sensor array 302 is an N by M array of pixels where each pixel outputs a digitized pixel charging signal having k bits, threshold memory 306 is N by M bits and the size of the time index memory 308 is N by M by m bits where m is the time resolution. In one embodiment, the resolution of sensor array 302 is 1000 by 1000 pixels outputting 10 bits each (i.e., N=M=1000 and k=10). Therefore, threshold memory 306 is 1 megabits, time index memory 308 with two bit time resolution is 2 megabits, and digital memory 310 is at least 1.2 megabytes. As a result of this memory configuration, each pixel in sensor array 302 can be individually stamped by threshold memory 306 and time index memory 308 and stored in digital memory 310.

As such, with the configuration outlined above and illustrated in FIG. 3, each pixel can be exposed to an image for different exposure times in order to compensate for light and dark portions of the image. Additionally, the information regarding how long an exposure time is associated with each pixel and the integrated intensity for that pixel is stored in time index memory 308 and digital memory 310. Further description of the image sensor 300 is provided in U.S. application Ser. No. 09/567,786, "Multiple Sampling via a Time-Indexed Method to Achieve Wide Dynamic Ranges," by David Yang, et al, one of which is the inventor hereof, filed on May 9, 2000, which is herein incorporated by reference in its entirety.

As seen in the configurations of FIGS. 2A–2B and 3, image sensor 302 includes a two-dimensional array of pixel elements, each having a photodetector and a supporting circuit with an A/D converter. According to one embodiment, each pixel element includes identical circuitry that may be implemented as described in U.S. Pat. No. 5,461,425 or alternatively may be implemented according to circuit 138 of FIG. 2B.

Regardless of the various implementations of circuit 138, each pixel element has to devote a certain amount of space in order to accommodate circuitry 138. In practice, either the size of the image sensor is enlarged or the size of the photodetector is reduced to accommodate circuit 138. In either case, either the production yield or the photodetector size is reduced. As the size of the photosensor becomes smaller, the efficiency and sensitivity of the photosensor is detrimentally decreased. Although some loss of sensitivity can be compensated for in circuit 132 by additional filtering and amplification, it is highly desirable to retain the sensitivity of photosensors while continuing to include supporting circuits with smaller feature sizes.

FIG. 4A shows a cross section of one embodiment of a single pixel 400 in a digital image sensor 450 according to the present invention. Pixel 400 includes pixel supporting circuitry formed on a substrate 401 and a photosensor 407 formed on a different substrate 402. Substrate 401 and substrate 402 can be identical or different semiconductor materials, but substrate 401 is preferably formed by CMOS process. Substrate 401 and substrate 402 are electrically coupled through connections 405 and 406. Connections 405 and 406, for example indium bumps, are formed on substrate 401 by well known processes in the art. Depending on an exact implementation, the material for the bumps may include solder, copper, silver or gold. Electrical connections from photosensor 407 to bumps 405 and 406 can be produced by forming deep vias in substrate 402.

If connections 405 and 406 are formed by indium bumping technology, for example, then indium is deposited at the locations for connections 405 and 406 on the back side of substrate 402 and the top side of substrate 401 depending on a specific process. It should be noted that references to the back side or the top side of a substrate is with respect to FIG. 4A and is not meant to mean any particular side of a piece of wafer used to produce the substrate. Electrical connections can be made to the indium by conventional metalization techniques. Substrate 401 can then be positioned over substrate 402 and pressed in place, forming cold wells between the indium deposited and forming connections 405 and 406.

According to one embodiment, photosensor 407 includes photo detection region 412 formed in substrate 402. Typically, substrate 402 includes a p-type region and photo detection region 412 is doped (e.g. by ion implantation) to form an n+ region in the p-type region.

As shown in the block diagram of substrate 401 in FIG. 4B, pixel supporting circuitry includes circuit 408 which, similar to circuit 132 of FIG. 2B, processes a signal received at connection 405. The analog pixel charging signal output from circuit 132 is input to A/D conversion circuit 409. A/D conversion circuit 409 may include an A/D converter or other circuits causing the analog pixel charging signal to become a digital signal charging signal in response to a clock signal CLK. One of the conversion circuits that can cause the analog pixel charging signal to convert to a digital signal charging signal is disclosed in pending U.S. application Ser. No. 09/274,202, entitled "Methods for Simultaneous Analog-to-digital Conversion and Multiplication", filed Mar. 22, 1999, by David Yang et al, one of whom is the inventor hereof, which is hereby incorporated by reference in its entirety.

FIG. 4C shows a diagram of photosensor 407. Photosensor 407 in FIG. 4C is modeled as a light sensitive current source 410 in parallel with a capacitor 411. Photosensor 407 is electrically coupled to connections 405 and 406 on substrate 401. Optionally, connection 406 can be omitted and a ground connection made to substrate 402. Grounding photosensor 407 with a separate connection on substrate 402 reduces the number of connections required by pixel 400 by half, i.e. only connection 405 is now required per pixel instead of two.

In some embodiments, an insulating layer 403 is also formed between substrate 401 and 402 in order to protect and separate substrates 401 and 402. Additionally, an optical filter 404 can be deposited over light collection region 412 of photosensor 407 so that photosensor 407 is sensitive to a particular color of light (e.g., red, green or blue light).

Figure 4D:
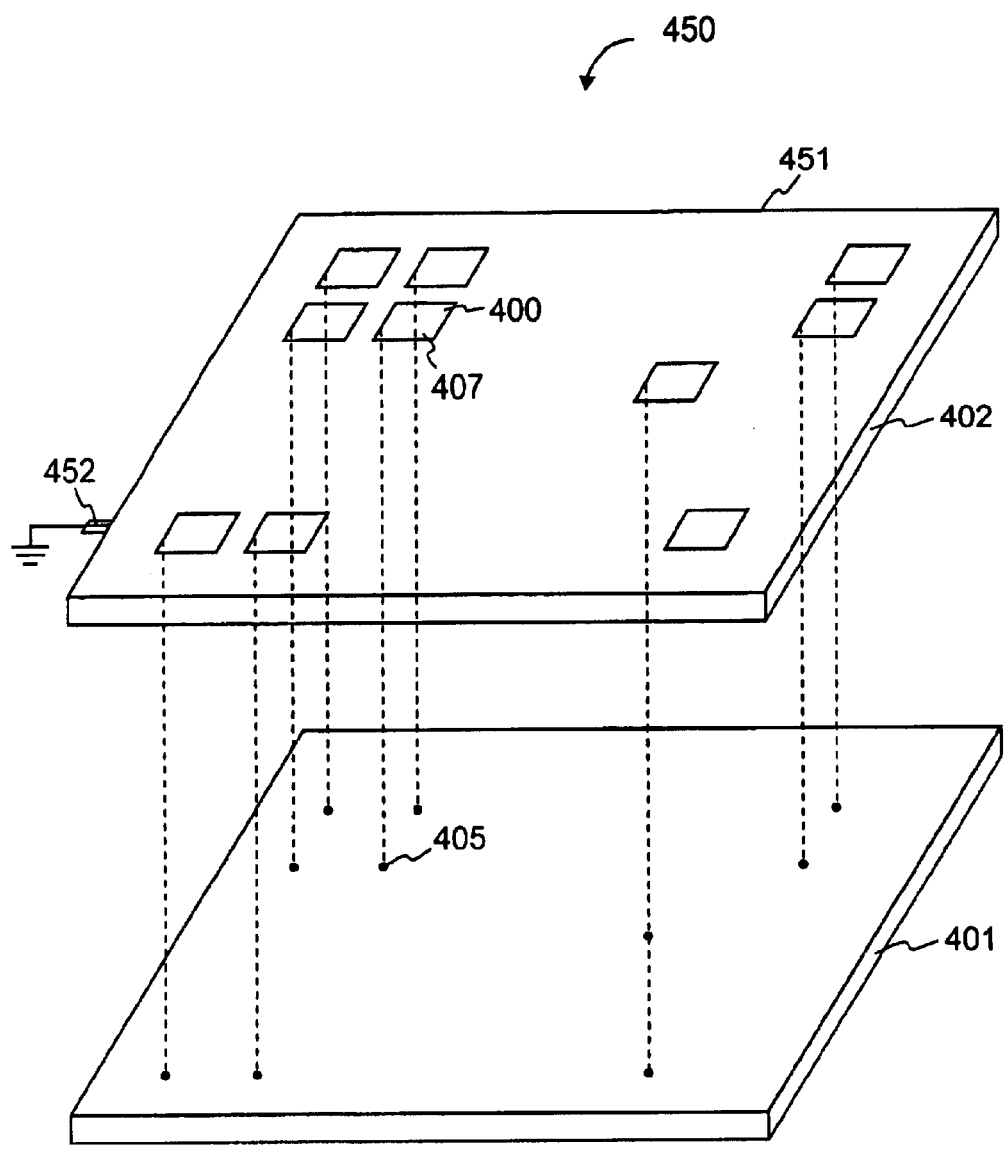

FIG. 4D shows photosensor array 451 of digital imaging device 450. Photosensor array 451 includes an N×M array of pixels, each of the N×M array of pixels being similar to pixel 400 shown in FIG. 4A. Substrate 402 includes an N×M array of photosensors, each of the N×M array of photosensors being similar to photosensor 407 shown in FIGS. 4A and 4C. In FIG. 4D, a separate ground is coupled to substrate 402 so that, for each pixel in the N×M array of pixels, only one connection 405 on substrate 401 is required to provide electrical connectivity. Each of the N×M array of photosensors is coupled to ground 452 so that connection 406 (FIG. 4A) is not required.

Substrate 401 includes pixel supporting circuitry, as shown in FIG. 4B, coupled to each of connections 405. According to another embodiment, substrate 401 includes control and read-out circuitry as well as storage memory, as described with FIGS. 2 and 3. Because substrate 401 is produced separately from substrate 402, different processing technology can be utilized for producing substrate 401 and substrate 402. Substrate 401, and the various circuitry produced on substrate 401, can be processed utilizing the most advanced CMOS technology. Substrate 402, then, can be processed to produce photosensors having optimized sensitivity and noise characteristics.

Furthermore, because very little supporting circuitry is included on substrate 402, almost the entire surface of substrate 402 can be devoted to photosensors. This allows for higher resolution photosensor arrays while retaining the benefits of CMOS technology for signal processing.

Figure 5A:
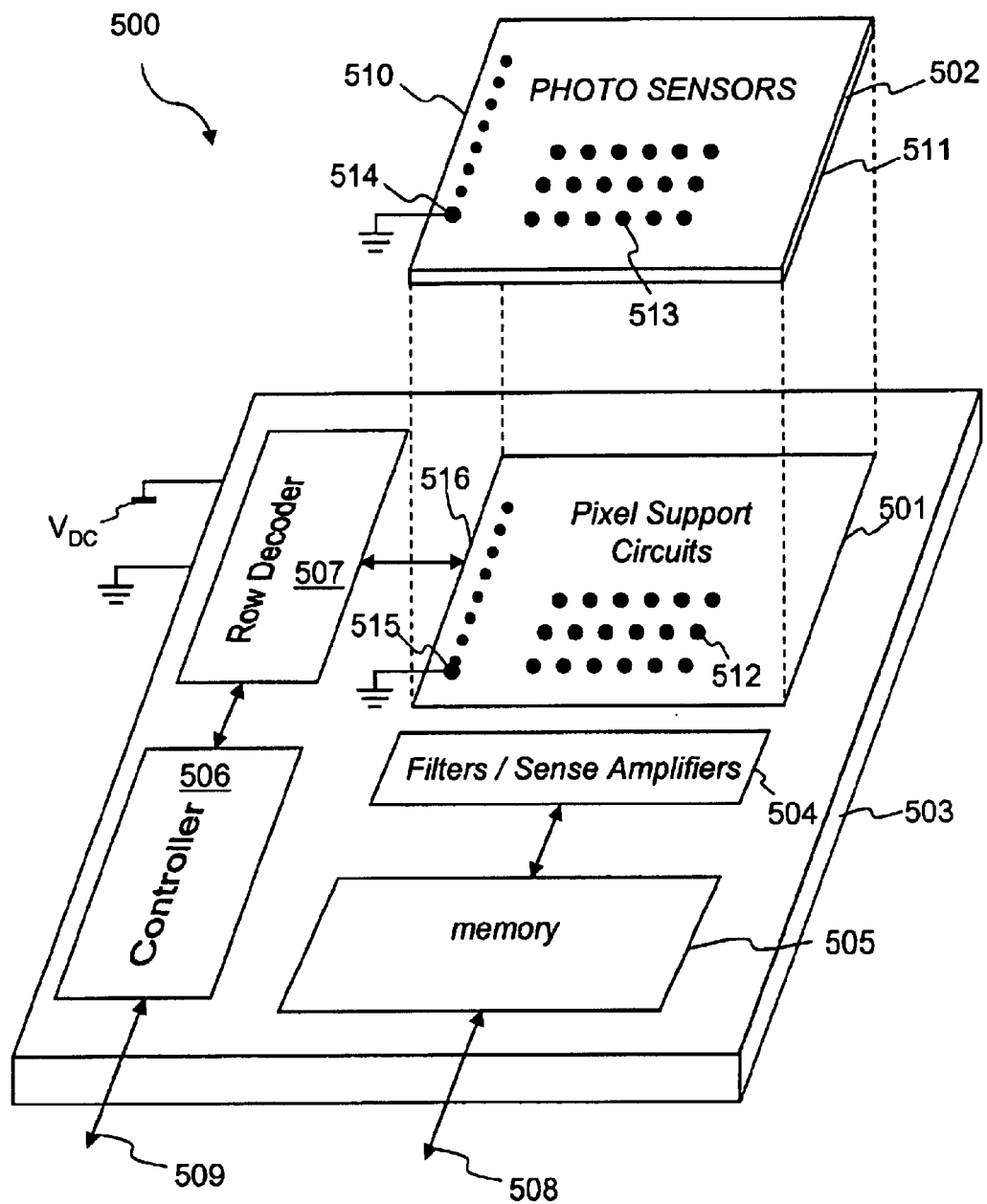
FIGS. 5A through 5C shoe respectively block diagrams of a digital image sensor according to the present invention.

FIG. 5A shows a digital imaging device 500. Imaging device 500 includes pixel support circuitry 501, photosensors 502, row decoder circuitry 507, controller 506, filters 504, and memory 505. One skilled in the art will recognize that at least a portion of these functions can be located external to substrate 503. As has been previously discussed with relation to FIGS. 2 and 3, row decoder 507 is coupled to pixel support circuitry 501 to control readout of digital pixel charge signals from each photosensor of photosensors 502. The digital pixel charge signal data stream is received by filters 504 and stored in memory 505. Memory 505 may also include threshold memory and time index memory, as described with FIG. 3. Controller 506 controls row decoder 507, memory 505 and photosensors 502 so that data is read out of digital imaging device 500 through port 508 in response to control signals received at port 509.

Photosensors 502 are constructed on substrate 511, while pixel support circuitry 501, filters/sense amplifiers 504, memory 505, controller 506 and row decoder 507 can be constructed on substrate 503. Substrate 511 is then positioned and brought into contact with substrate 503 so that photosensors 502 are electrically coupled to pixel support circuits 501 and control signals and ground can be input to photosensors 502. In some embodiments, control signals can be input to photosensors 502 through a port 510. Substrate 511 can be of any size to support sufficient resolutions provided by the image sensor 500. Additionally, any type of supporting circuitry may be constructed on substrate 503. In other words, substrate 503 is not confined only to pixel support circuit 501.

As has been previously discussed, electrical conductivity between photosensors 502 and pixel support circuitry can be provided by an array of conductive bumps 512 provided on the surface of substrate 503. The conductive bumps 512 align with a similar array of conductive points 513 on the bottom surface of substrate 511. Conductive points 513 are electrically coupled to individual photosensors of photosensors 502. Conductive bumps 512 are electrically coupled to individual circuits in pixel support circuitry 501.

Any method of electrically coupling photosensors 502 with pixel support circuitry 501 can be utilized. One method includes deep conductor filled vias in substrate 511, each of the vias electrically coupled to a photosensor in photosensors 502, making electrical contact with a metalization line on substrate 503. Substrate 511 can then be epoxied to substrate 503.

Indium bumping technology can also be utilized. If conductive bumps 511, and the corresponding conductive points 513 on the bottom surface of substrate 511, are indium bumps, then substrate 511 and substrate 503 can be cold-welded into place. The cold welding process includes aligning substrate 502 over substrate 503 so that conductive points 513 and bumps 511 are aligned and applying pressure between substrate 502 and substrate 503 at ambient temperature. Indium readily welds to itself under pressure, so if both conductive points 513 and bumps 511 are of indium then pressing substrate 511 and substrate 503 together will weld the pieces in place. Ground input 514 may be similarly welded to ground port 515 on substrate 503. Similarly, control inputs 510 maybe welded to control port 516 of substrate 503. In addition, a dielectric epoxy may be selectively applied between substrate 511 and 503, without interfering with conductive points 513 and bumps 511, in order to help hold substrate 511 and substrate 503 in place.

Photosensors 502 and substrate 511 can be as described with photosensors 407 and substrate 402 in FIGS. 4A through 4D. Additionally, pixel support circuitry 501 and substrate 503 can be as described in pixel support circuitry of substrate 401 in FIGS. 4A through 4D. However, in some embodiments, more than one photosensor can utilize an electrical coupling (i.e., one of conductive points 513 and the corresponding bump 411) between substrate 511 and substrate 503.

Figure 5B:
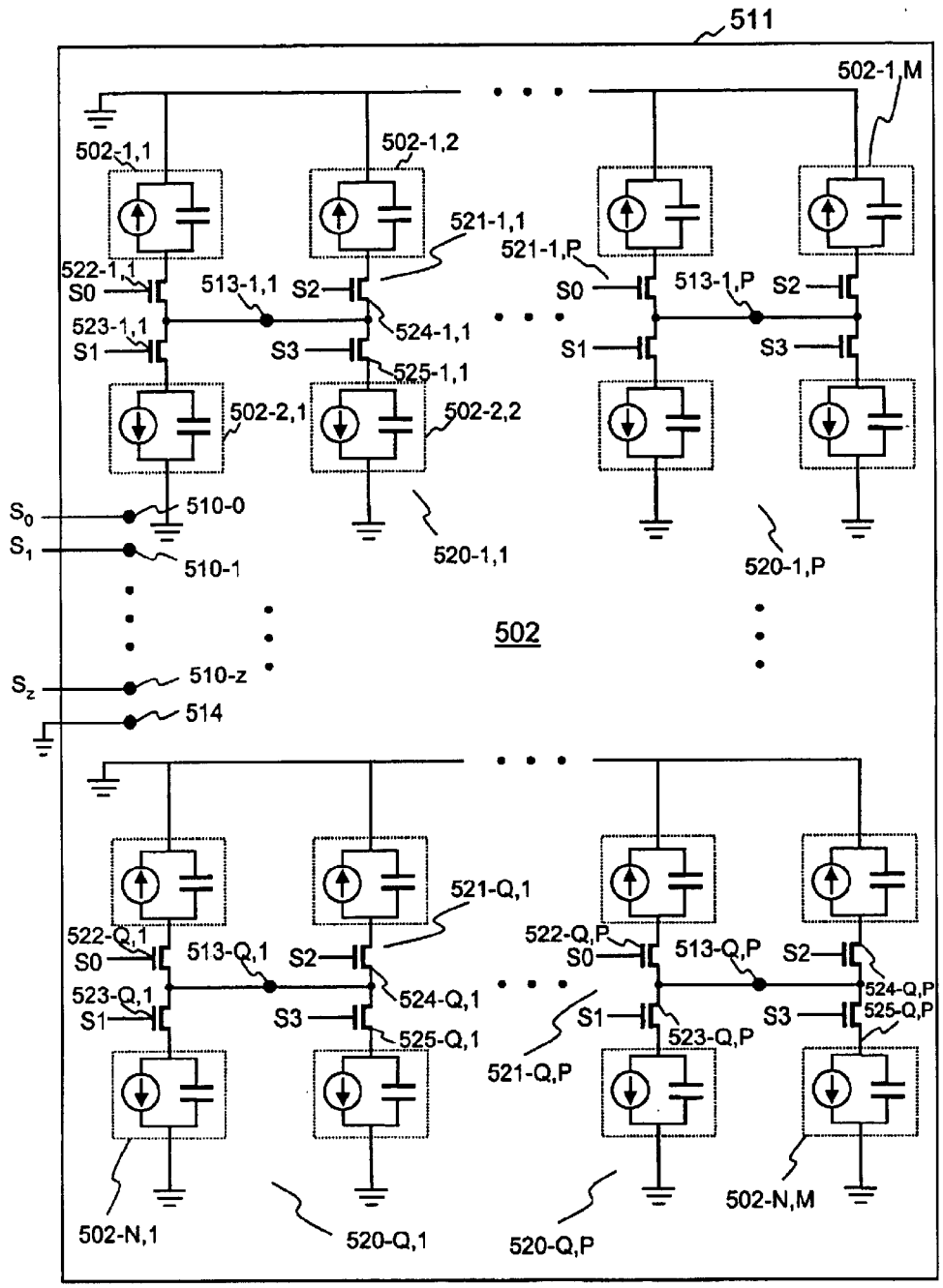
Figure 5C:
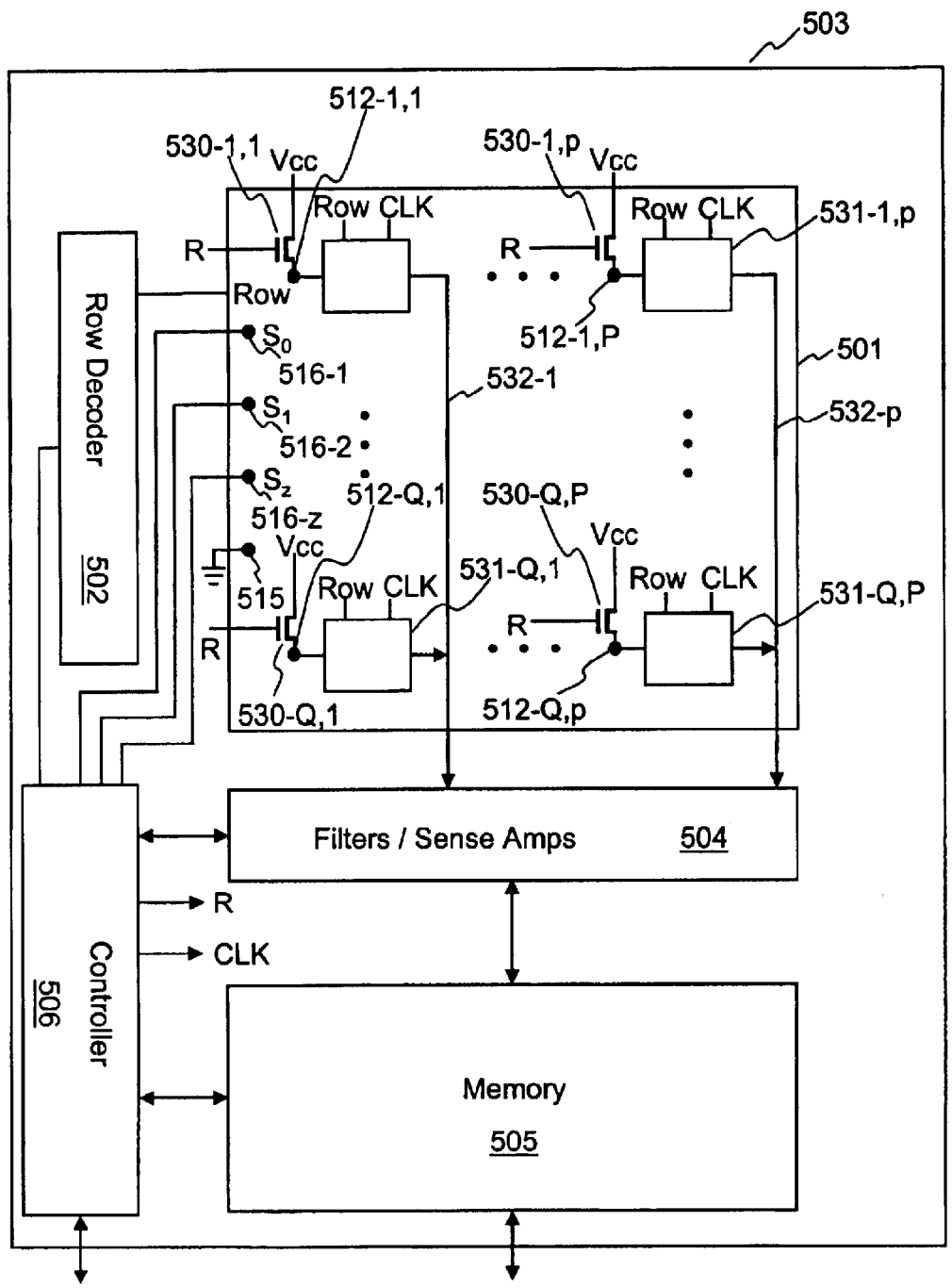

With indium bumping technology, the pitch of bumps 512 can be slightly larger than the pitch of photosensors 502; for example, the pitch of bumps 512 may be about 0.20 $\mu$m. However, the density of individual photosensors of photosensors 502 is limited. In the example in which the size of the photosensors can not be smaller than 0.20 $\mu$m, multiplexing process as detailed below may be used. As an alternative to individual photosensors utilizing one of bumps 512, as was described with FIGS. 4A through 4D, multiple photosensors can utilize a single one of bump 512. FIGS. 5B and 5C show an embodiment where multiple photosensors utilize each bump of bumps 512.

FIG. 5B shows a block diagram of photosensors 502 on substrate 511 where multiple individual photosensors share one of electrical connections 513. Photosensor 502 is an N by M array of photosensors having individual photosensors 502-1,1 through 502-N,M (i.e., a photosensor array having N rows and M columns of photosensors). Photosensors 502-1,1 through 502-N,M are grouped into clusters 520-1,1 through 520-Q,P, each of clusters 520-1,1 through 520-Q,P having Z+1 photosensors. The clusters can be formed in any grouping of photosensors 502. In most embodiments, each of clusters 520 includes the same number of photosensors 502. In FIG. 5B, cluster 520-1,1, for example, includes photosensor 502-1,1, photosensor 502-1,2, photosensor 502-2,1, and photosensor 502-2,2. Cluster 520-1,1 may include other photosensors as well.

In most embodiments, with Z+1 photosensors in each cluster, an array of Q=N/sqrt(Z+1) by P=M/sqrt(Z+1) clusters is formed, wherein sqrt( ) is the square root operator. One particularly convenient grouping is with Z=3 so that each group of four photosensors may have color-sensitive photosensors in red, green and blue as shown in FIG. 2A.

Each photosensor in one of clusters 520, e.g. 520-1,1, is coupled through multiplexers 521, e.g. multiplexer 521-1,1 through 521-Q,P, in order to share a single one of connections 513, e.g., 513-1,1 through 513-Q,P. Each of multiplexers 521 includes Z+1 individual transistors, each coupled to receive the output from one of the photosensors cluster 520. In FIG. 5B, clusters 520-1,1 through 520-P,Q each includes multiplexers 521-1,1 through 521-P,Q, respectively. Each of multiplexers 521-1,1 through 521-P,Q includes transistors 522-1,1 through 522-P,Q, 523-1,1 through 523-P,Q, 524-1,1 through 524-P,Q, and 525-1,1 through 525-P,Q. Transistors 522-1,1 through 522-P,Q are each turned on by control signal $S_0$, transistors 523-1,1 through 523-P,Q are turned on by control signal $S_1$, transistors 524-1,1 through 524-P,Q are turned on by control signal $S_2$, and transistors 525-1,1 through 525-P,Q are turned on by control signal $S_3$. Control signals $S_0$ through $S_Z$ are input at connections 510-0 through 510-Z, respectively. Therefore, each of control signals $S_0$ through $S_Z$ turns on an entire set of transistors, which in turn couples a set of photosensors to connections 513-1,1 through 513-Q,P. $S_0$ turns on the set of transistors 522, for example. When the set of transistors 522, for example, is turned on, the set of photosensors coupled to transistors 522 are coupled to connections 513. For example, when transistor 522-1,1 is turned on by signal $S_0$, then photosensor 502-1,1 is coupled to connection 513-1,1.

FIG. 5C shows a block diagram of substrate 503 for receiving photosensor 502 on substrate 511 shown in FIG. 5B. Pixel support circuits 501 include a P by Q array of pixel circuitry. Bump connection 512-1,1 through 512-Q,P is coupled through transistor 530-1,1 through 530-Q,P, respectively, to $V_{cc}$. Transistors 530-1,1 through 530-Q,P are each coupled to receive a reset signal, as has previously been described. Bump connections 512-1,1 through 512-Q,P are also coupled to circuits 531-1,1 through 531-Q,P, respectively. Each of circuits 531-1,1 through 531-Q,P includes filters, amplifiers and a digital to analog converter to convert a signal received at 512-1,1 through 512-Q,P to a digital pixel charge signal. A digital pixel charge signal is coupled to lines 532-1 through 532-P in response to Row signals from Row decoder 507. Filters 504 receive the digital pixel charge signals from lines 532-1 through 532-P and stores the corresponding digitized image in memory 505.

Signals $S_0$ through $S_Z$ are communicated to substrate 511 through bumps 516-1 through 516-Z. Substrate 511 is grounded through bump 515.

In operation, each of photosensors 502-1,1 through 502-N,M can be charged by setting each of signals $S_0$ through $S_Z$ high and setting the reset signal high (i.e., at or near $V_{cc}$). Once each of photosensors 502-1,1 through 502-N,M are charged, then signals $S_0$ through $S_Z$ and the reset signal are set to low. Substrate 511, containing photosensors 502, can then be exposed to an image where a portion of the image falls on each of photosensors 502-1,1 through 502-N,M for a set period of time. During the exposure time, each of photosensors 502-1,1 through 502-N,M integrates the amount of light received. In some embodiments, each of photosensors 502-1,1 through 502-N,M includes a colored filter so that, at each photosensor, only light of particular wavelengths is integrated. In some embodiments, as was described with FIG. 3, each cluster of photosensors can be set to integrate received light from the image for a predetermined period of time.

Once the integration step is complete, then the read-out process is started. Read-out is accomplished for each of set of photosensors. A set of photosensors is selected by setting one of control signals $S_0$ through $S_Z$ high, connecting the corresponding photosensor in each of clusters 520-1,1 through 520-Q,P to connections 513-1,1 through 513-Q,P, respectively. Once the readout is complete for one set of photosensors, controller 506 can set another of control signals $S_0$ through $S_Z$ high until all photosensors have been read out.

The above description and figures are for example only and are not intended to be limiting. One of ordinary skill in the art will recognize numerous variations that, although not specifically discussed, are within the scope of this disclosure. As such, the invention is limited only by the following claims.

I claim:

1. A digital image sensor comprising:
   a first substrate including an array of photosensors, each photosensor producing an analog charging signal when the array of photosensors is exposed to a scene; and
   a second substrate communicating with the first substrate through an array of conductive bumps bonding the first substrate to the second substrate, the second substrate including an array of pixel supporting circuits, each pixel supporting circuit receiving the analog charging signal from one of the photosensors through a corresponding one of the conductive bumps,
   wherein each of the pixel supporting circuits includes an analog-to-digital conversion circuit and converts the analog charging signal to a digital charging signal.

2. The image sensor of claim 1, wherein the first substrate includes all array of multiplexers, each multiplexer being coupled to a group of photosensors in the array of photosensors such that the analog charging signal from each of the photosensors in the group is coupled to one of the pixel supporting circuits.

3. The image sensor of claim 2, wherein the group of photosensors includes a first photosensor having a first-colored filter, a second photosensor having a second-colored filter, a third photosensor having a third-colored filter, and a fourth photosensor having one of the first-colored filter, the second-colored filter and the third-colored filter.

4. The image sensor of claim 3, wherein the first colored filter is a red filter, the second colored filter is a green filter and the third colored filter is a blue filter.

5. The image sensor of claim 3, wherein the first colored filter, the second colored filter and the third colored filter are fabricated to sense identical light spectrum.

6. The image sensor of claim 1, wherein the analog-to-digital convention circuit is an analog-to-digital converter with a predefined data precision.

7. The image sensor of claim 1, wherein the first substrate is fabricated with a first CMOS process.

8. The image sensor of claim 7, wherein the second substrate is fabricated with a second CMOS process.

9. The image sensor of claim 7, wherein each of the conductive bumps is formed with indium deposition in either one of the first substrate and the second substrate.

10. The image sensor of claim 1, wherein the conductive bumps are formed using a material selected from a group consisting of indium, copper, solder, silver and gold.

11. The image sensor of claim 1, wherein the second substrate further includes a digital data memory coupled to the array of pixel supporting circuits such that the digital charging signal from each of the pixel supporting circuits can be stored directly in the digital data memory.

12. A method of forming a digital image sensor, the method comprising:
    forming a photosensor array on a first substrate;
    forming pixel support circuitry including an array of pixel circuits on a second substrate, each pixel circuit including an analog to digital converter; and
    coupling the first substrate to the second substrate such that a signal from each photosensor in the photosensor array can be received by a pixel circuit in the array of pixel circuits.

13. The method of claim 12, wherein the coupling the first substrate to the second substrate comprises coupling the first substrate to the second substrate using indium bumping.

14. The method of claim 12, wherein coupling the first substrate to the second substrate comprises forming bumps of a material from a group consisting of indium, copper, solder, silver and gold.

15. The method of claim 12, further comprising forming multiplexer circuits on the first substrate, each multiplexer circuit being coupled to a group of photosensors of the photosensor array.

16. A method of digitally receiving an image from a scene, comprising:
    receiving light at a photosensor array formed on a first substrate, each photosensor in the photosensor array generating a charge signal in response to the light; and
    receiving the charge signals from the photosensors in the photosensor array at an array of support circuits formed on a second substrate, each of the support circuits generating a digital signal in response to the charge signal received from a photosensor of the photosensor array.

17. The method of claim 16, further comprising multiplexing the charge signals from a group of photosensors in the photosensor array so that each of the support circuits receives charge signals from each of the photosensors in the group in response to a control signal.

* * * * *